(12) United States Patent
Shen et al.

(10) Patent No.: US 8,198,740 B2
(45) Date of Patent: Jun. 12, 2012

(54) SEMICONDUCTOR PACKAGE STRUCTURE AND ENCAPSULATING MODULE FOR MOLDING THE SAME

(75) Inventors: Cheng-Chang Shen, Kaohsiung (TW); Chen-Tsung Chang, Fengshan (TW); Chih-Yuan Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 97 days.

(21) Appl. No.: 12/579,049

(22) Filed: Oct. 14, 2009

(65) Prior Publication Data

US 2010/0258957 A1 Oct. 14, 2010

(30) Foreign Application Priority Data

Apr. 9, 2009 (TW) ................................ 98111891 A

(51) Int. Cl.
*H01L 23/31* (2006.01)
(52) U.S. Cl. ................. 257/787; 257/E23.124
(58) Field of Classification Search .................. 257/787, 257/E23.124; 425/520
See application file for complete search history.

(56) References Cited

U.S. PATENT DOCUMENTS

| 5,959,363 A * | 9/1999 | Yamada et al. ............. 257/787 |
| 6,452,268 B1 | 9/2002 | Huang |
| 6,743,706 B2 | 6/2004 | Huang |
| 7,301,228 B2 | 11/2007 | Usui et al. |

FOREIGN PATENT DOCUMENTS

| CN | 1255082 A | 5/2000 |
| CN | 1516272 A | 7/2004 |
| CN | 1855453 A | 11/2006 |
| WO | WO-98/50216 | 11/1998 |

* cited by examiner

*Primary Examiner* — Cuong Q Nguyen
*Assistant Examiner* — Trang Tran
(74) *Attorney, Agent, or Firm* — Muncy, Geissler, Olds & Lowe, PLLC

(57) ABSTRACT

A semiconductor package structure and encapsulating module for molding the same and an encapsulating mold for molding the same are provided. The encapsulating mold is used for packaging a substrate having a chip so as to mold the substrate having the chip as a package structure. The encapsulating mold has a pressing surface, a smooth surface and a cavity. The smooth surface having a curvature radius is connected with the pressing surface and disposed at a mouth of the cavity. When the encapsulating mold and an encapsulating lower mold are jointed to hold the substrate, the pressing surface contacts and presses the substrate.

7 Claims, 2 Drawing Sheets

SEMICONDUCTOR PACKAGE STRUCTURE AND ENCAPSULATING MODULE FOR MOLDING THE SAME

This application claims the benefit of Taiwan application Serial No. 98111891, filed Apr. 9, 2009, the subject matter of which is incorporated herein by reference.

BACKGROUND OF THE INVENTION

1. Field of the Invention

The invention relates in general to a semiconductor package structure and an encapsulating module for molding the same, and more particularly to a semiconductor package structure whose sealant has a smooth surface and an encapsulating module for molding the same.

2. Description of the Related Art

Normally, the encapsulating mold is used during the process of packaging the substrate. The encapsulating mold has a cavity and a pressing surface. After the pressing surface contacts and presses the substrate, the cavity is filled with sealant. The sealant, having been cooled and solidified, is fixed on the substrate.

However, if there are radical changes in the shape of the interconnection between the pressing surface and the cavity of the encapsulating mold, many problems will arise. For example, the shape of the connection is a sharp corner. A number of disadvantages are exemplified below:

Firstly, when the encapsulating mold contacts and presses the substrate, what firstly contacts and presses the substrate are the pressing surface and the cavity. If the contact part has radical change in the appearance, such as a sharp corner. The sharp corner cuts and incurs tremendous stress on the substrate. The surface treatment layer and the metallic structure disposed on the substrate such as wires and pads are thus damaged. For example, Referring to FIG. 1, the semiconductor package of a generally known encapsulating mold having a sharp corner is shown. On the part of the encapsulating mold 200, the contact part between the pressing surface 202 and the cavity 204 is a sharp corner P1 with radical change in the appearance, wherein the sharp corner P1 makes the corresponding part of the substrate 206 to form a sharp corner P2. As the sharp corner P2 of the semiconductor package structure bears a high stress, the surface treatment layer (not illustrated), such as a solder mask, on the substrate 206 will be damaged or peeled off.

Secondly, if the contact part has a radical change in the appearance, such as a sharp corner, the soft surface treatment layer disposed on the substrate when pressed is likely to bulge and peel off the surface treatment layer.

Thirdly, in terms of the mold theory, during the process of cooling and solidification, hot spots are likely to be formed on the portion of the mold having a radical change in the shape, such as a sharp corner, is likely to have, hence shortening the lifespan of the mold.

Fourthly, the part of the mold on which hot spots are formed will affect the quality of the semiconductor package structure.

SUMMARY OF THE INVENTION

The invention is directed to a semiconductor package structure and an encapsulating module for molding the same. An encapsulating mold of the encapsulating module has a pressing surface and a cavity. The encapsulating mold contacts and presses a substrate by the pressing surface. The cavity has a smooth surface, which is connected with the pressing surface. When the pressing surface contacts and presses the substrate, what the substrate contacts is a smooth surface rather than a sharp corner P1 as in a generally known technology, so that the stress beared by the substrate is reduced, and no much stress is left on the fabricated semiconductor package structure.

According to a first aspect of the present invention, an encapsulating module is provided. The encapsulating module is jointed with an encapsulating lower mold for packaging a substrate having a chip so as to mold the substrate having the chip as a semiconductor package structure. The encapsulating module includes an encapsulating lower mold and an encapsulating mold. The encapsulating lower mold is used for carrying a substrate. The encapsulating mold has a pressing surface, a first smooth surface and a cavity. The first smooth surface having a curvature radius is connected with the pressing surface and disposed at a mouth of the cavity. Wherein, when the encapsulating mold and the encapsulating lower mold are jointed to hold the substrate, the pressing surface contacts and presses the substrate.

According to a second aspect of the present invention, a semiconductor package structure is provided. The semiconductor package structure is packaged by using an encapsulating mold. The encapsulating mold has a pressing surface, a first smooth surface and a cavity. The first smooth surface having a curvature radius is connected with the pressing surface and disposed at a mouth of the cavity. The semiconductor package structure has a second smooth surface, and includes a substrate, a chip and a sealant. The sealant is disposed on the substrate, the sealant has an outer lateral surface, the second smooth surface connects the outer lateral surface with the substrate, and the shape of the second smooth surface corresponds to that of the first smooth surface.

According to a third aspect of the present invention, a semiconductor package structure is provided. The semiconductor package structure is packaged by using an encapsulating mold. The encapsulating mold has a pressing surface, a first smooth surface and a cavity. The first smooth surface being a part of an elliptical surface is connected with the pressing surface and disposed at a mouth of the cavity. The semiconductor package structure has a second smooth surface, and includes a substrate, a chip and a sealant. The sealant is disposed on the substrate, the sealant has an outer lateral surface, the second smooth surface connects the outer lateral surface with the substrate, and the shape of the second smooth surface corresponds to that of the first smooth surface.

The invention will become apparent from the following detailed description of the preferred but non-limiting embodiments. The following description is made with reference to the accompanying drawings.

DETAILED DESCRIPTION OF THE INVENTION

The invention provides a package structure and an encapsulating module for molding the same. An encapsulating mold of the encapsulating module has a pressing surface, a smooth surface and a cavity. The encapsulating mold contacts and presses the substrate by the pressing surface. The smooth surface is connected with the pressing surface and disposed at a mouth of the cavity. During the packaging process, when the pressing surface contacts and presses the substrate, what contacts the substrate is a smooth surface, so that the stress beared by the substrate is reduced, and no much stress is left on the fabricated package structure. Furthermore, the smooth surface is located at the interconnection between the pressing surface and the cavity, and this is conducive to assure or prolong the lifespan of the mold.

A number of preferred embodiments are disclosed below for elaborating the invention. However, the embodiments and the accompanying drawings are for exemplification purpose only, not for limiting the scope of protection of the invention. Also, secondary elements are omitted in the embodiments for highlighting the technical features of the invention.

Figure 2:
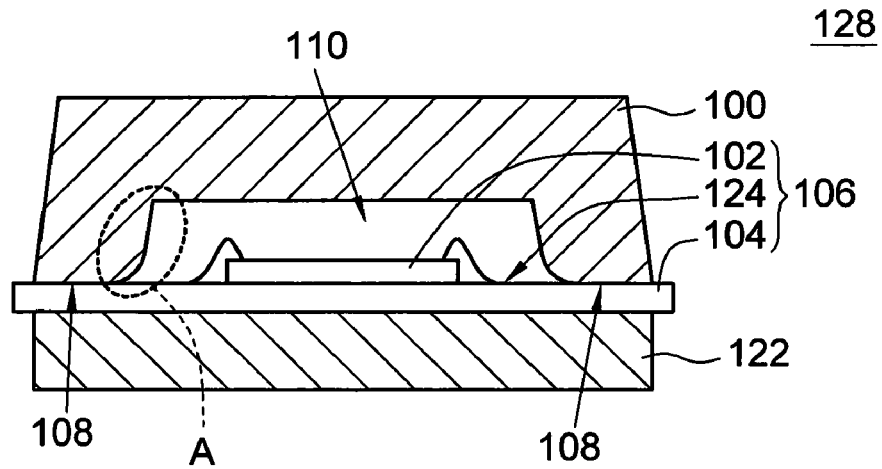
FIG. 2 shows an encapsulating mold according to a preferred embodiment of the invention.
Figure 3:
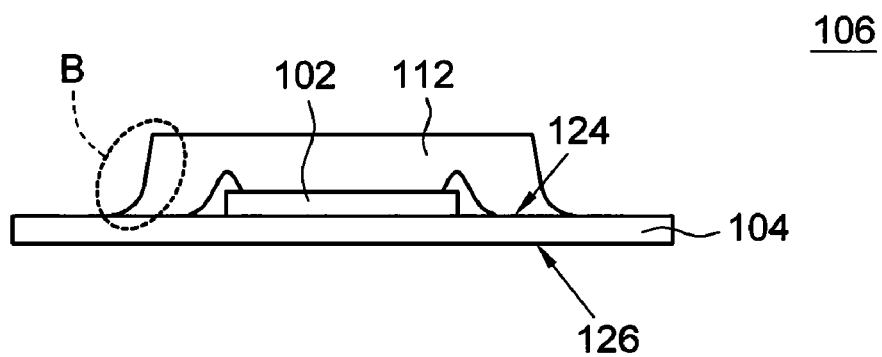
FIG. 3 shows a semiconductor package structure packaged by using the encapsulating mold of FIG. 2.

Referring to both FIG. 2 and FIG. 3. FIG. 2 shows an encapsulating mold according to a preferred embodiment of the invention. FIG. 3 shows a semiconductor package structure packaged by using the encapsulating mold of FIG. 2. As indicated in FIG. 2, the encapsulating module 128 is used for packaging a substrate 104 having a chip 102 as a semiconductor package structure 106. The encapsulating module 128 includes an encapsulating mold 100 and an encapsulating lower mold 122. The encapsulating lower mold 122 is used for carrying the substrate 104. The encapsulating mold 100 has a pressing surface 108 and a cavity 110. The encapsulating mold 100 and the encapsulating lower mold 122 can be jointed to hold the substrate 104 between the encapsulating mold 100 and the encapsulating lower mold 122. Furthermore, when the encapsulating mold 100 and the encapsulating lower mold 122 are jointed, the pressing surface 108 contacts and presses the substrate 104 so that the substrate 104 is held between the encapsulating mold 100 and the encapsulating lower mold 122. The cavity 110 is used for receiving a sealant 112 (illustrated in FIG. 3), so that the sealant 112 is disposed on the substrate surface 124 of the substrate 104 for encapsulating the chip 102.

Figure 4:
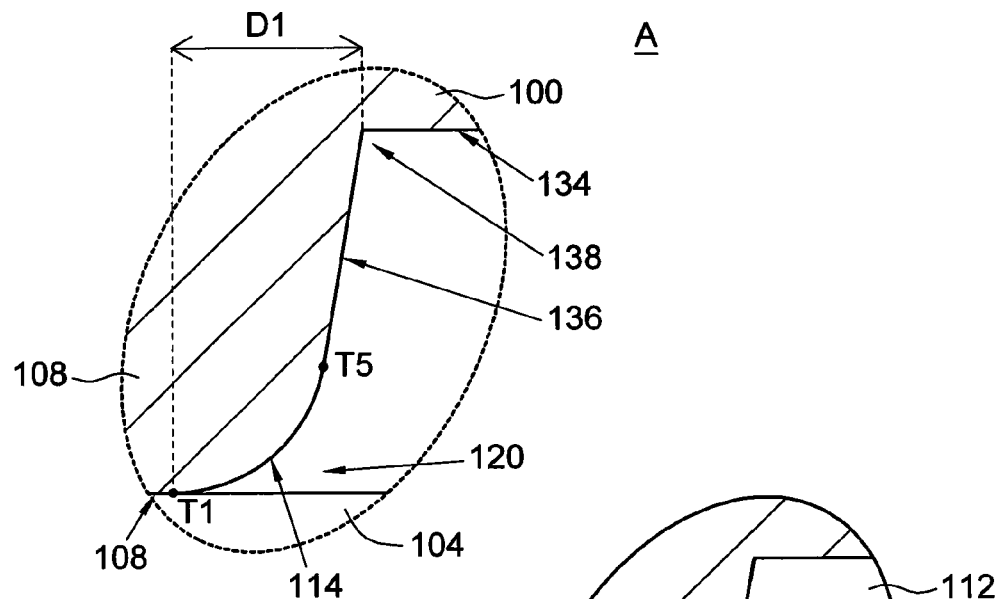
FIG. 4 shows an enlargement of a region A of FIG. 2.

Referring to both FIG. 4, an enlargement of a region A of FIG. 2 is shown. As indicated in FIG. 4, the encapsulating mold 100 has a first smooth surface 114 which contacts the cavity 110. The first smooth surface 114 is tangent to the pressing surface 108. As the first smooth surface 114 is tangent to the pressing surface 108, when the encapsulating mold 100 contacts and presses the substrate 104, what contacts the substrate 104 is a border line T1 of the first smooth surface 114 that is tangent to the pressing surface 108 rather than a sharp-shaped appearance (such as a sharp corner) as in a generally known technology. The first smooth surface 114 does not damage the surface treatment layer and the metallic structure disposed on the substrate 104. Wherein, the surface treatment layer is a solder mask for example, and the metallic structure is a pad or a wire for example. Unlike the sharp corner which may over-press the soft surface treatment layer disposed on the substrate 104, the first smooth surface 114, having a smooth appearance, avoids the surface treatment layer being bulged and peeled off.

As indicated in FIG. 4, during the packaging process, when the cavity 110 (illustrated in FIG. 2) is filled with the melted sealant, the melted sealant fills the space 120 between the substrate 104 and the first smooth surface 114 and contacts the first smooth surface 114, so that the contact area between the melted sealant and the encapsulating mold 100 is increased. Thus, the sealant filling the space 120 shares the force applied onto the substrate 104 by the encapsulating mold 100, and reduces the stress beared by the substrate 104 as well as the force applied onto the surface treatment layer and the metallic structure disposed on the substrate 104 by the encapsulating mold, so that the surface treatment layer and the metallic structure will not be damaged by the force applied thereto.

As indicated in FIG. 4, an inner-wall top surface 134 of the cavity 110 is connected with an inner-wall lateral surface 136 of the cavity 110. The inner-wall top surface 134 is opposite to the substrate 104. The inner-wall lateral surface 136 is connected with and preferably tangent to the first smooth surface 114. The interconnection 138 between the inner-wall top surface 134 and the inner-wall lateral surface 136 and the tangent point T1 between the first smooth surface 114 and the pressing surface 108 are separated by a predetermined distance D1, which ranges from 0.78 mm to 1.85 mm for example.

Figure 5:
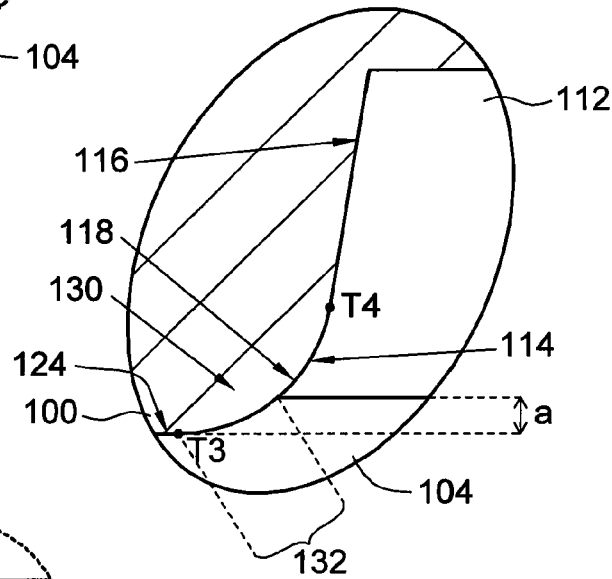
FIG. 5 shows an encapsulating mold according to another preferred embodiment of the invention.

FIG. 4 shows that what contacts the substrate 104 is the border line T1 of the first smooth surface 114 that is tangent to the pressing surface 108. However, when the encapsulating mold 100 and the encapsulating lower mold 122 are jointed, the first smooth surface 114 can also contact the substrate 104 by a part of the first smooth surface 114. For example, referring to FIG. 5, an encapsulating mold according to another preferred embodiment of the invention is shown. In FIG. 5, the first smooth surface 114 is exemplified by a range between the tangent point T3 and the tangent point T4. When the encapsulating mold 100 and the encapsulating lower mold 122 (illustrated in FIG. 2) are jointed, the substrate surface 124 might be slightly indented so as to form a recess 130 if the force applied by the encapsulating mold 100 is large enough. As the first smooth surface 114 contacts the substrate surface 124 by a portion 132 having a smooth appearance rather than by a sharp corner which occurs in a generally known technology, the substrate 104 is less likely to bear too large a stress and become further indented. Also, the sealant filling in the space 120 (illustrated in FIG. 4) shares a part of the force applied by the encapsulating mold 100, so that the indentation of the recess 130 is tiny, and this is conducive to maintain the treatment layer and the metallic structure on the substrate 104 intact.

Figure 1:
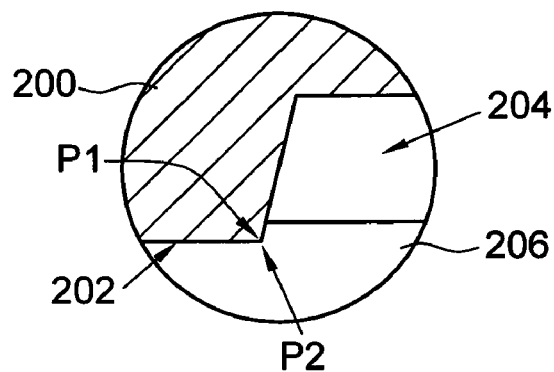
FIG. 1 (Prior Art) shows the package of a generally known encapsulating mold having a sharp corner.

Moreover, as the recess 130 of the substrate 104 has a smooth appearance corresponding to the portion 132 of the first smooth surface 114, and the concentration of stress which occurs to the sharp corner P2 of FIG. 1 of a generally known technology is less likely to occur.

Besides, the line of intersection of the first smooth surface 114 and a section is continual and differentiable as long the first smooth surface is smooth. For example, the first smooth surface 114 can be a part of a circular surface whose curvature radius ranges from 0.1 mm to 2.0 mm, preferably, 0.6 mm. Or, the first smooth surface 114 can be a part of an elliptical surface whose major axis ranges from 0.1 mm to 1.17 mm and minor axis ranges from 0.1 mm to 1.0 mm.

Figure 6:
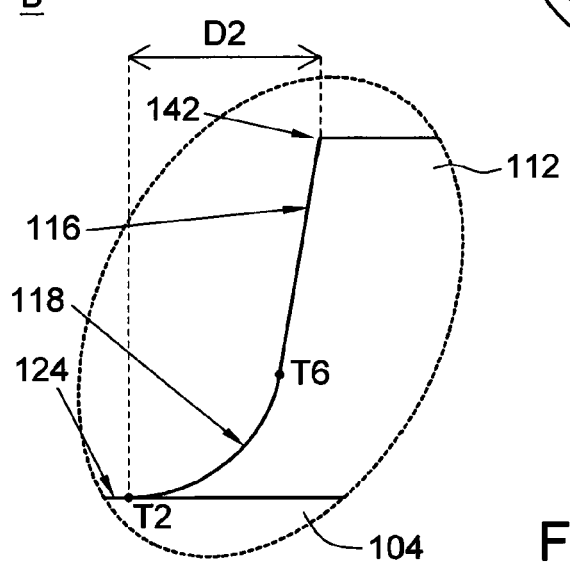
FIG. 6 shows an enlargement of a region B of FIG. 3.

Referring to FIG. 6, an enlargement of a region B of FIG. 3 is shown. After the sealant 112 is disposed on the substrate 104, a second smooth surface 118 of the semiconductor package structure 106 is connected with an outer lateral surface 116 of the sealant 112 and the substrate surface 124, wherein the second smooth surface 118 corresponds to the first smooth surface 114 and is exemplified by the range between the tangent point T2 and the tangent point T6.

As indicated in FIG. 6, after the sealant 112 is formed, the outer lateral surface 116 of the sealant 112 is connected with a sealant top surface 140 of the sealant 112. The tangent point T2 between the second smooth surface 118 and the substrate surface 124 and the interconnection 142 between the sealant top surface 140 and the outer lateral surface 116 are separated by a predetermined distance D2, wherein the predetermined distance D2 is the same with the predetermined distance D1 and ranges from 0.78 mm to 1.85 mm.

During the packaging process, the melted sealant fills the space 120 between the substrate 104 and the first smooth surface 114 of the encapsulating mold 100. After the melted sealant cools and solidifies, the semiconductor package structure 106 forms a second smooth surface 118. As the first smooth surface 114 has a smooth appearance, the second smooth surface 118 has a smooth appearance too. Moreover, the second smooth surface 118 is tangent to the substrate surface 124 at the tangent point T2 of FIG. 6 for example.

Furthermore, if the first smooth surface 114 is a part of a circular surface, then the second smooth surface 118 is a corresponding circular surface, and if the first smooth surface 114 is a part of an elliptical surface, then the second smooth surface 118 is a corresponding elliptical surface. The dimension of the second smooth surface 118 corresponds to that of the first smooth surface 114 accordingly.

The semiconductor package structure referred in the present embodiment of the invention can be a ball grid array (BGA) package structure, which has a number of solder balls (not illustrated) disposed on the bottom surface 126 of the semiconductor package structure 106 of FIG. 3. However, the above example is not for limiting the invention, and any package structures fabricated using the encapsulating mold disclosed in the above embodiments are the semiconductor package structure referred in the present embodiment of the invention.

The package structure, the encapsulating module for molding the same and the encapsulating mold for molding the same disclosed in the above embodiments of the invention have many advantages exemplified below.

Firstly, during the packaging process, when the pressing surface contacts and presses the substrate, a portion of the first smooth surface contacts the substrate or the part of the first smooth surface tangent to the pressing surface contacts the substrate, so that the stress beared by the substrate is reduced, and the surface treatment layer and the metallic structure maintain intact.

Secondly, a smooth portion of the first smooth surface or the part of the first smooth surface tangent to the pressing surface contacts the soft surface treatment layer disposed on the substrate is, so that the soft surface treatment layer on the substrate will not be over-pressed, the soft surface treatment layer will not be bulged so as to peel off.

Thirdly, the cavity contacts the pressing surface by a portion of the first smooth surface having a smooth appearance or the part of the first smooth surface tangent to the pressing surface rather than a sharp corner. Thus, the encapsulating mold, having better heat conduction during the cooling and solidification process of the sealant, is less likely to form hot spots, and this is conducive to assure or prolong the lifespan of the mold.

Fourthly, as hot spots are less likely to be formed at the interconnection between the cavity of the encapsulating mold and the pressing surface, no much stress is left on the fabricated package structure, and the quality of the semiconductor package structure is thus assured and improved.

Fifthly, during the packaging process, the sealant filling the space shares the force applied onto the substrate by the encapsulating mold and reduces the stress received by the substrate as well as the force applied onto the surface treatment layer and the metallic structure disposed on the substrate by the encapsulating mold so that the surface treatment layer and the metallic structure will not be damaged by the force applied thereto.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An encapsulating module used for packaging a substrate having a chip so as to package the substrate and the chip as a package structure, wherein the encapsulating module comprises:
   an encapsulating lower mold used for carrying the substrate; and
   an encapsulating mold having a pressing surface, a first smooth surface and a cavity, wherein the first smooth surface is a curved surface and connected with the pressing surface and disposed at the mouth of the cavity, and when the encapsulating mold and the encapsulating lower mold are jointed to hold the substrate, the pressing surface contacts and presses the substrate.

2. The encapsulating module according to claim 1, wherein the first smooth surface is tangent to the pressing surface.

3. The encapsulating module according to claim 2, wherein an inner-wall top surface of the cavity is connected with an inner-wall lateral surface of the cavity, the inner-wall top surface is opposite to the substrate, and the inner-wall lateral surface is connected with the first smooth surface;
   wherein, the inner-wall top surface and the inner-wall lateral surface are connected at an interconnection, the first smooth surface and the pressing surface are connected at a tangent point, and the interconnection and the tangent point are separated by a distance between 0.78 mm to 1.85 mm.

4. The encapsulating module according to claim 3, wherein the first smooth surface is an elliptical surface.

5. The encapsulating module according to claim 1, wherein the cavity is used for receiving a sealant, so that the sealant is disposed on the substrate, encapsulates the chip and contacts the first smooth surface.

6. The encapsulating module according to claim 1, wherein the first smooth surface has a curvature radius which ranges from 0.1 mm to 2.0 mm.

7. The encapsulating module according to claim 1, wherein a line of intersection between the first smooth surface and its cross-section is continual and differentiable.

\* \* \* \* \*